(12) United States Patent
Wang et al.

(10) Patent No.: US 6,726,804 B2
(45) Date of Patent: Apr. 27, 2004

(54) RF POWER DELIVERY FOR PLASMA PROCESSING USING MODULATED POWER SIGNAL

(76) Inventors: Liang-Guo Wang, 59 Jacklin Cir., Milpitas, CA (US) 95035; Kwok M. Wong, 1636 Larkin Ave., San Jose, CA (US) 95129; Shamouil Shamouilian, 6536 Little Falls Dr., San Jose, CA (US) 95120; Kartik Ramaswamy, 3282 St. Ignatius Pl., #322, Santa Clara, CA (US) 95051

( * ) Notice: Subject to any disclaimer, the term of this patent is extended or adjusted under 35 U.S.C. 154(b) by 0 days.

(21) Appl. No.: 09/767,282

(22) Filed: Jan. 22, 2001

(65) Prior Publication Data

US 2002/0096257 A1 Jul. 25, 2002

(51) Int. Cl.[7] .................... H05H 1/00; C23C 16/00
(52) U.S. Cl. .................... 156/345.44; 156/345.43; 156/345.47; 156/345.48; 118/723 E; 118/723 I
(58) Field of Search .............. 156/345.43, 345.44, 156/345.47, 345.48; 118/723 E–723 I; 315/111.21, 111.61, 111.51; 438/710, 712; 427/569

(56) References Cited

U.S. PATENT DOCUMENTS

| 4,585,516 | A | | 4/1986 | Corn et al. ............... 156/643 |
| 4,808,258 | A | * | 2/1989 | Otsubo et al. ............ 438/710 |
| 5,057,185 | A | | 10/1991 | Thomas, III et al. ....... 156/643 |
| 5,513,765 | A | | 5/1996 | Usui ............................ 216/68 |
| 5,556,549 | A | | 9/1996 | Patrick et al. ............... 216/61 |
| 5,562,952 | A | | 10/1996 | Nakahigashi et al. ....... 427/534 |
| 5,643,364 | A | | 7/1997 | Zhao et al. .............. 118/723 E |
| 5,688,357 | A | | 11/1997 | Hanawa ...................... 156/345 |
| 5,824,606 | A | | 10/1998 | Dible et al. ................. 438/729 |
| 5,866,985 | A | | 2/1999 | Coultas et al. .......... 315/111.21 |
| 5,981,899 | A | | 11/1999 | Perrin et al. ........... 219/121.52 |
| 6,106,737 | A | | 8/2000 | Tomoyasu et al. ............ 216/67 |
| 6,471,821 | B2 | * | 10/2002 | Ogino et al. ........... 156/345.44 |
| 2002/0066537 | A1 | * | 6/2002 | Ogino et al. ........... 156/345.44 |
| 2003/0000646 | A1 | * | 1/2003 | Ogino et al. ........... 156/345.44 |

FOREIGN PATENT DOCUMENTS

JP         10-150025 A    *   6/1998    ....... H01L/21/3065

OTHER PUBLICATIONS

Rex Miller and Mark R. Miller "Modulation and Demodulation"; *Electronics The Easy Way*, (1995) pp. 207–226.

* cited by examiner

Primary Examiner—Parviz Hassanzadeh
(74) Attorney, Agent, or Firm—Townsend & Townsend & Crew; Joseph Bach

(57) ABSTRACT

A plasma processing apparatus and a method of operating a plasma processing apparatus are disclosed. In one embodiment, a first RF signal at a carrier frequency and a second RF signal at a second frequency are generated. An amplitude modulated signal is formed by modulating the first RF signal with the second RF signal. A plasma is generated within the plasma processing chamber using the amplitude modulated signal. Generating plasma using a frequency modulated signal is also disclosed.

7 Claims, 5 Drawing Sheets

RF POWER DELIVERY FOR PLASMA PROCESSING USING MODULATED POWER SIGNAL

BACKGROUND OF THE INVENTION

The present invention relates plasma processing apparatuses and methods, and power systems for plasma processing apparatuses. Plasma processing apparatuses are used to etch and deposit different materials in industries such as the semiconductor industry. For example, in a typical dry etching process, a semiconductor wafer including a layer to be etched is disposed within an etch chamber. A gaseous plasma is created in the chamber using radio frequency (RF) power at a single fixed frequency. The created plasma passes through an etch mask on the layer to etch it and form a desired pattern.

It is desirable to increase the number of controllable processing parameters in a plasma processing apparatus. More controllable process parameters provide process engineers with more ways to control the operation of the apparatus to optimize a given process. One way to increase the number of parameters is to use two separate, fixed frequency power sources instead of one fixed frequency power source in the plasma processing apparatus. Power signals at two different fixed frequencies can be applied to a reactant gas in the processing chamber to form a plasma instead of power at one frequency. To further increase the number of process parameters, the duty cycles of the power signals can be modulated. Duty cycle modulation is described in detail below.

FIG. 1 shows a conventional plasma reactor apparatus with two, high power, fixed frequency power sources 21, 24 coupled to a chamber 10. An upper electrode 12 forms part of the chamber 10 and is grounded. One source 21 generates a high power, high frequency RF signal at, e.g., 13.56 MHz. The other source 24 generates a high power, low frequency RF signal at, e.g., 100 KHz. The high and low frequency signals pass from the power sources 21, 24 through respective impedance matching networks 23, 26, and to central and lower electrodes 13, 15. The lower electrode 15 forms part of a wafer chuck which supports a wafer to be processed.

In the apparatus, a control means 27 controls two modulators 22, 25. The two modulators 22, 25 modulate the RF signals coming from the high and low frequency power sources 21, 24 before being sent to the electrodes 13, 15. RF signals from the respective power sources 21, 24 are modulated to provide a duty cycle of 100% or less. "Duty cycle" refers to the fraction, expressed as a percent, per unit time that a signal is "on" or applied to a load. For example, a signal that is applied to a load one-half the time has a fifty percent duty cycle.

Duty cycle modulation is a type of "pulse modulation" and can be described in greater detail with reference to FIG. 2. FIG. 2 illustrates a pair of waveforms representing the control signals from the control means 27 to the modulators 22, 25. Waveforms 31 and 32 represent the signals to modulators 22 and 25, respectively. As illustrated in FIG. 2, a process is initiated at a time A and the 13.56 MHz signal from source 21 is continuously applied to electrode 13 until the process is discontinued at time B. Meanwhile, the control signal 32 is supplied to the modulator 25 to turn the 100 KHz signal from the source 24 on and off at some suitable rate. In this example, the duty cycle of signal 31 is 100% and the duty cycle of signal 32 is approximately 50%.

The matching networks 23, 26 in the apparatus reduce the amount of power reflected back to the RF power sources 21, 24. During processing, the plasma within the chamber forms an impedance (capacitive reactance) which changes. An RF mismatch arises between the power sources 21, 24 and the plasma so that some of the RF power is reflected back to the power sources 21, 24. The matching networks 23, 26 compensate for the changing plasma impedance. Each matching network 23, 26 is adapted to minimize power reflections at the frequencies of the power sources 21, 24. For example, a power source providing power at 100 MHz uses a matching network designed to reduce reflections of power at about 100 MHz. If too much power is reflected back to the power sources 21, 24, the power sources 21, 24 may be detrimentally driven into foldback.

While the described apparatus is suitable for some applications, many improvements could be made. For example, it would be desirable if the apparatus was less complex, and consequently less costly to manufacture. The apparatus has two different matching networks 23, 26 for two different high power, fixed frequency power sources 21, 24. Each matching network 23, 26 includes a number of components such as variable capacitors, electric motor servos, and an RF detector circuit. In addition to being complex, many of the components of the matching networks 23, 26 are bulky and can fail. Also, an apparatus using two high power sources 21, 24 is more complex and consumes more energy than an apparatus using one high power, fixed frequency power source. Increased energy consumption leads to increased operating costs.

Also, when using two high power fixed frequency power sources in the apparatus, the power sources and matching networks can interfere with each other. For example, in some conventional apparatuses, two separate different fixed frequency power sources deliver different frequencies of power to the same electrode (e.g., the wafer chuck). In this situation, the two fixed power source/matching network combinations are electrically coupled to each other. When fixed frequency power is applied to the chamber by one power source, the other power source and its associated matching network can act as a load to the other power source. Consequently, some power can be inadvertently diverted from one power source/matching network combination to another combination instead of to the reactant gas in the chamber. The interference between different power sources and matching networks can be reduced by decoupling electronics. However, using decoupling electronics in the apparatus further increases the cost and the complexity of the apparatus.

Also, when two high power, fixed frequency power signals are delivered to a chamber, they can interfere with each other and cause arcing. Arcing can cause instabilities in the plasma and can cause undesired process variations. Arcing can be avoided by limiting the gas pressure range in the chamber, reducing the total RF power, or reducing the low frequency power applied to the chamber. Although the likelihood of arcing can be reduced by limiting the range of process parameters such as these, it is sometimes desirable to enable broader ranges of such process parameters to be used without inducing arcing.

In addition, while the apparatus can deliver one or two fixed frequency, duty cycle modulated power signals to the chamber, the apparatus has a relatively small number of adjustable process parameters. For example, the apparatus only provides for a) one or two fixed frequencies of power to a chamber, and b) the ability to turn the power on and off at some rate. While the ability to modulate the duty cycle of a power signal provides some ability to control the plasma process, the power provided by a duty cycle modulated power signal is still at a single frequency and amplitude. Consequently, the controllable variability of the plasma process is limited.

Embodiments of the invention address these and other problems.

SUMMARY OF THE INVENTION

One embodiment of the invention is directed to a plasma processing apparatus. The apparatus comprises: a single carrier source adapted to generate a first RF signal at a carrier frequency; a modulation source adapted to generate a second RF signal at a modulation frequency; a modulator adapted to modulate the first RF signal with the second RF signal to form an amplitude modulated signal, wherein the amplitude modulated signal contains peaks with amplitudes greater than or less than amplitudes of the peaks of the first RF signal; and a plasma processing chamber coupled to the modulator.

Another embodiment of the invention is directed a plasma processing apparatus. The apparatus comprises: a carrier source adapted to generate a first RF signal at a carrier frequency; a modulation source adapted to generate a second RF signal at a modulation frequency; a modulator adapted to modulate the first RF signal with the second RF signal to form a frequency modulated signal; and a plasma processing chamber coupled to the modulator.

Another embodiment of the invention is directed to a method of delivering a power signal to a plasma processing chamber. The method comprises: generating a first RF signal at a carrier frequency; generating a second RF signal at a modulating frequency; forming an amplitude modulated (AM) signal by modulating the first RF signal with the second RF signal, wherein the amplitude modulated signal contains peaks with amplitudes greater than or less than amplitudes of peaks of the first RF signal; and delivering only the amplitude modulated signal to a reactant gas within the plasma processing chamber to form a plasma.

Another embodiment of the invention is directed to a method of delivering a power signal to a plasma processing chamber. The method comprises: generating a first RF signal at a carrier frequency; generating a second RF signal at a modulation frequency; forming a frequency modulated (FM) signal by modulating the first RF signal with the second RF signal; and generating a plasma within the plasma processing chamber using the frequency modulated signal.

Yet other embodiments of the invention are directed to power systems for plasma processing apparatuses. The power system embodiments may include a carrier source adapted to generate a first RF signal at a carrier frequency; a modulation source adapted to generate a second RF signal at a modulation frequency; and a modulator adapted to modulate the first RF signal with the second RF signal to form a frequency and/or an amplitude modulated signal These and other embodiments of the invention are discussed in further detail below with reference to the Figures and the Detailed Description.

DETAILED DESCRIPTION

Figures 1, 2:
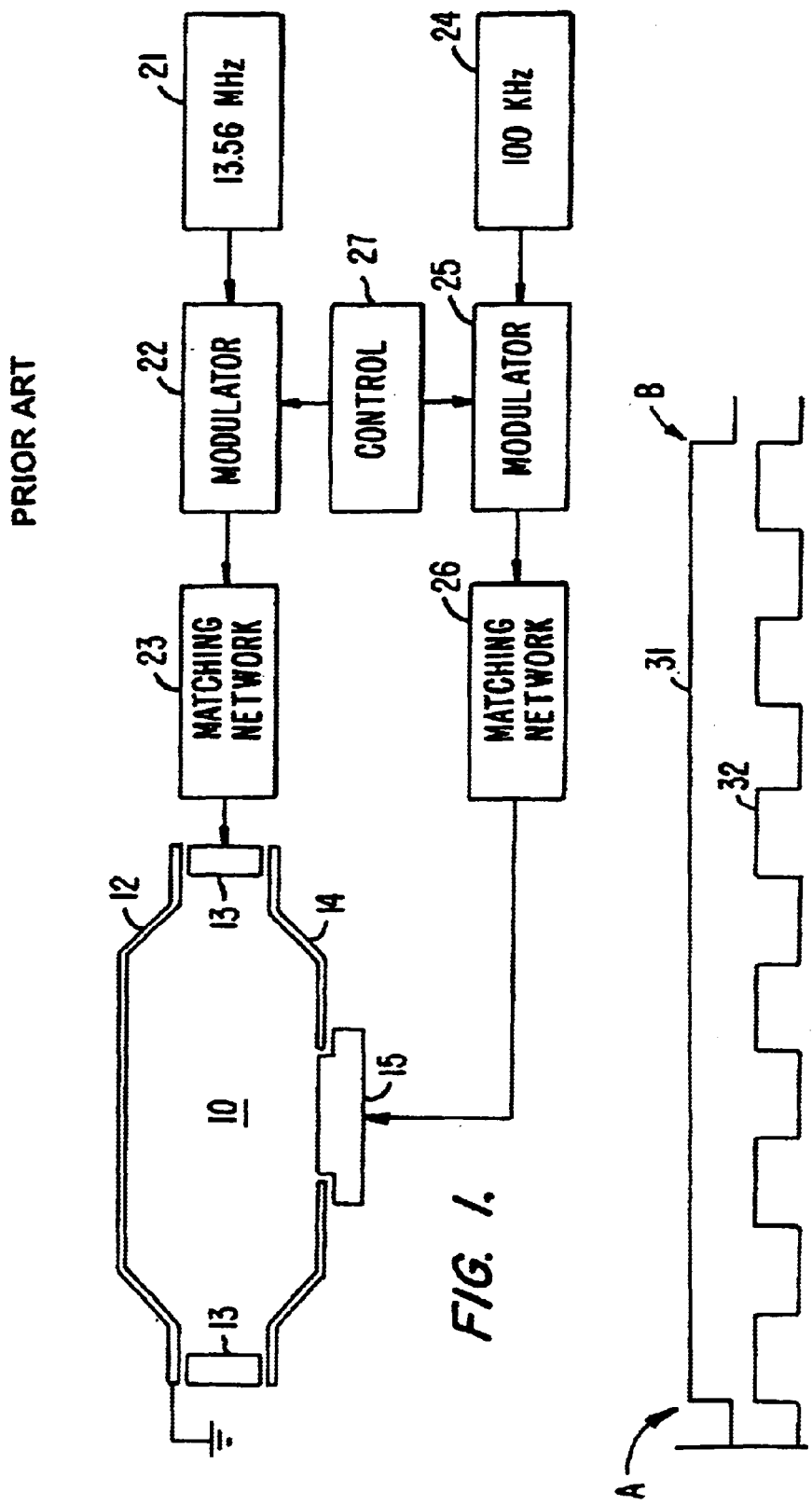
FIG. 1 illustrates a conventional dual frequency plasma processing apparatus.
FIG. 2 illustrates two waveforms of power signals used in the dual frequency plasma processing apparatus in FIG. 1.

In embodiments of the invention, a radio-frequency power signal is amplitude, frequency, or amplitude and frequency modulated. The modulated power signal can have a waveform which is simple or complex. When the modulated power signal is applied to a reactant gas in a chamber, it can produce a plasma with unique characteristics. The waveform of the modulated power signal can be modified by adjusting parameters such as the modulation index, the modulation frequency, and the power of the carrier signal. Adjustments such as these can be made without making significant hardware changes to the plasma processing apparatus. In embodiments of the invention, more processing parameters are available for a process engineer to adjust to optimize a given process than many conventional plasma processing apparatuses. This increased processing capability is provided while advantageously decreasing the complexity of the apparatus.

In embodiments of the invention, a modulated RF power signal is transmitted to a plasma processing chamber in a plasma processing apparatus. A first RF signal is generated at a carrier frequency. The first RF signal is modulated by a second RF signal at a modulation frequency. The resulting modulated signal may be an amplitude modulated signal, a frequency modulated signal, or a signal which is both amplitude and frequency modulated. The first RF signal and the second RF signal may also be tuned in frequency.

In the amplitude modulated signal embodiments, at least some of the peaks of the amplitude modulated signals have amplitudes greater or less than the amplitudes of the peaks of the first RF signal. The peak amplitudes of the modulated power signal are different than the peak amplitudes of the carrier signal. A power signal with a unique waveform can be created and used to create a unique plasma tailored for a given process. As explained in further detail below, by modulating the amplitude of a carrier signal, process variables such as ion energy can be controlled. In comparison, in a duty cycle modulated power signal, all signal peaks are at the same amplitude as the carrier signal. In a duty cycle modulated power signal, a carrier signal is only turned "on" and "off" without modifying the frequency or peak amplitudes of the carrier signal. When the carrier signal is "off", peaks are not present.

Embodiments of the invention provide a number of controllable process parameters for process engineers to change the characteristics of the power signal applied to the reactant gas. In embodiments of the invention, the waveform for the power signal can be changed by adjusting parameters such as the modulation frequency, the carrier signal power, and the modulation index (the modulation index is the relative strength of the modulating signal to the carrier signal). By changing the waveform of the power signal, the characteristics of the power signal and the formed plasma can also be changed. The plasma can be changed so that it is optimized for a given process. The waveform can be advantageously changed without making significant hardware changes to the plasma processing apparatus and without increasing the complexity of the apparatus.

In comparison, in many conventional apparatuses, it is difficult to produce complex waveforms without making significant hardware changes. For example, it is difficult for one to change the frequency of power in a conventional plasma processing apparatus such as the one shown in FIG. 1 without making significant hardware changes. Each matching network 23, 26 in the apparatus shown in FIG. 1 is specifically adapted for the frequency of power generated by its corresponding power source 21, 24. In order to change the frequency of the power delivered to the chamber 10, both the power source 21, 24 and its matching network 23, 26 would be changed in some way. Matching networks minimize power reflections from variable, fixed frequency power sources. They typically include variable capacitors and inductors, or banks of fixed value components that are switched in and out. Changing a power source and its matching network to modify the frequency of a power signal delivered to a chamber is undesirable since doing so requires substantial hardware modifications.

In a plasma process, the nature of the RF power applied to a reactant gas can determine the characteristics of the resulting plasma. For example, higher frequency power is generally more effective than lower frequency power to generate ions from a reactant gas. High frequency power is generally characterized as power which is at a frequency of about 10 MHz or higher. Increasing the amount of generated ions generally increases the ion density of a plasma. The ion density of a plasma can affect processing variables in a deposition or an etching process. For example, a plasma with a high ion density generally etches a material faster than a plasma with a low ion density.

Lower frequency power, on the other hand, generally contributes more to ion energy than higher frequency power. Low frequency power is generally characterized as power having a frequency of less than 1 MHz. By controlling the energy of the ions formed in the plasma, the plasma can be optimized for a deposition or an etching process. For example, in a plasma-enhanced chemical vapor deposition (PECVD) process, low frequency power can be used to control the energy of the ions in the plasma to bombard a substrate to deposit a film. The increased ion bombardment control can be used to improve the density, stress, and integrity of the formed film. In another example, low frequency power can produce high energy ions that bombard a film to etch very deep profiles in the film in a plasma etch process. Accordingly, the use of low frequency power to generate a plasma is desirable in an anisotropic etch process.

The amplitude of the RF power signal may also influence the characteristics of the generated plasma. Amplitude modulated RF power signals are believed to behave like low frequency power signals in that they can be used to control the energy of the ions in the plasma. For example, an amplitude modulated RF signal having a waveform with high peaks can direct ions along longer travel paths than an RF signal having a waveform with small peaks. The ions can accelerate as they travel along the longer paths provided by the amplitude modulated RF signal, thus producing high energy ions.

In some embodiments of the invention, the frequency of a carrier signal can be modulated to form a frequency modulated power signal. The frequency modulated signal may have components with lower and higher frequencies than the carrier signal. In the plasma, the high frequency components can concentrate on the center part of a plasma body and can contribute more to ion density. Lower frequency components can concentrate on the sheath region of the plasma and can contribute more to ion energy. The peaks of the frequency modulated signal may have the same or different amplitudes as the peaks of the carrier signal. The frequency modulated power signal can be adjusted to modify process variables such as the ion density of the plasma or the ion energy.

In other embodiments of the invention, the amplitude of a carrier signal can be modulated to form an amplitude modulated power signal with peaks having higher or lower amplitudes than the peaks of the carrier signal. The frequency of the amplitude modulated power signal may be the same or different than the frequency of the carrier signal. By modulating the amplitudes of the carrier signal, the modulated power signal may have a unique waveform. Process variables such as the ion energy may be controlled by an amplitude modulated carrier signal.

In yet other embodiments of the invention, a carrier RF signal may be both amplitude and frequency modulated. In these embodiments, a carrier signal may be modulated with an amplitude modulating signal and a frequency modulating signal from a modulation source. By modulating both the frequency and the amplitude of a carrier power signal, the modulated power signal can have a unique waveform. For example, the modulated signal may have peaks of higher and lower amplitudes than the carrier signal peaks, and may have components with higher and lower frequency than the carrier signal frequency. The modulated power signal can produce a unique plasma that can be optimized for a given process. For example, a carrier signal can be modulated to have many high frequency components and high peak amplitudes to form a high density plasma with high energy ions.

Figure 3:
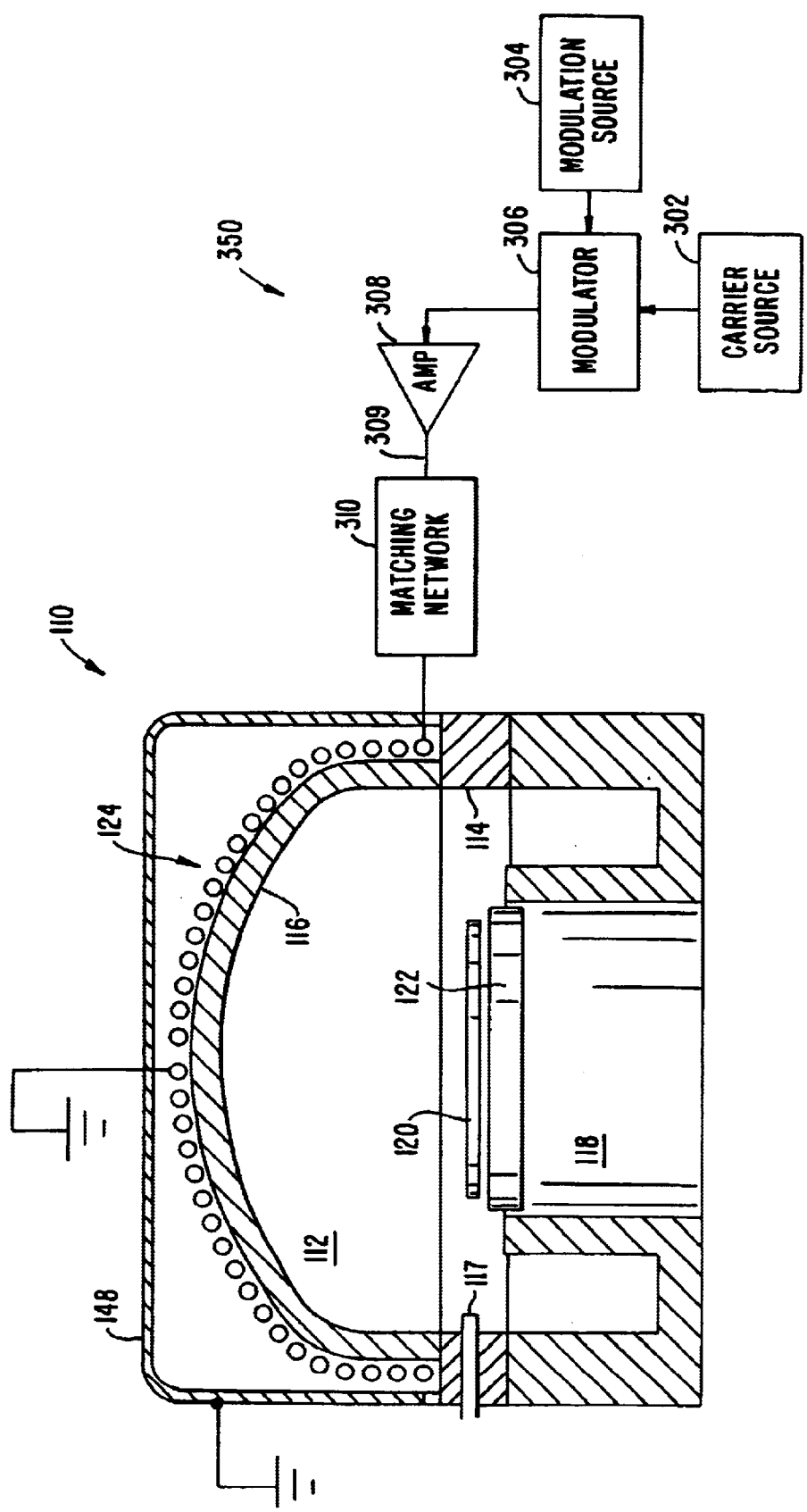
FIG. 3 illustrates a plasma processing apparatus according to an embodiment of the invention.

FIG. 3 illustrates an apparatus according to an embodiment of the invention. Referring to FIG. 3, an inductively coupled RF plasma processing apparatus 110 includes a sealed plasma processing chamber 112 bounded by a generally cylindrical conductive (metal) side wall 114 and a dielectric (e.g., quartz) dome-shaped ceiling 116. An RF shield 148 covers the ceiling 116 and is grounded. A gas inlet 117 coupled to a gas manifold (not shown) provides an ionizable reactant gas to the interior of the chamber 112. Ionizable reactant gases supplied through the gas inlet 117 may include gases suitable for an etch process (e.g., $CF_4$) or gases suitable for a deposition process (e.g., silane). A wafer pedestal 118 in the middle of the chamber 112 supports a semiconductor wafer 120 on an isolated conductive top 122. The wafer pedestal 118 may be a ceramic electrostatic chuck. A vacuum pump (not shown) maintains the interior of the chamber 112 at a desired pressure (e.g., between 0 and 100 milliTorr). Used process gas passes out of a gas outlet (not shown) in communication with the chamber 112.

RF power is coupled to the plasma (not shown) in the chamber 112 by a coiled antenna 124 wound around the exterior of the dome-shaped ceiling 116. The coil 124 is coupled to a power system 350 that supplies a modulated RF power signal to the chamber 112. Although the power system 350 is shown as being coupled to the coiled antenna 124 in FIG. 3, it may be coupled to any suitable part of the substrate processing apparatus. For example, in a parallel plate capacitively-coupled plasma processing chamber, the power system 350 may be coupled to either the lower electrode within the substrate support pedestal or to the gas manifold (upper electrode) of the apparatus. The power system 350 includes a carrier source 302, a modulation source 304, a modulator 306, an amplifier 308, a transmission line 309, and a matching network 310. Each of these components is described in more detail below.

Figure 4:
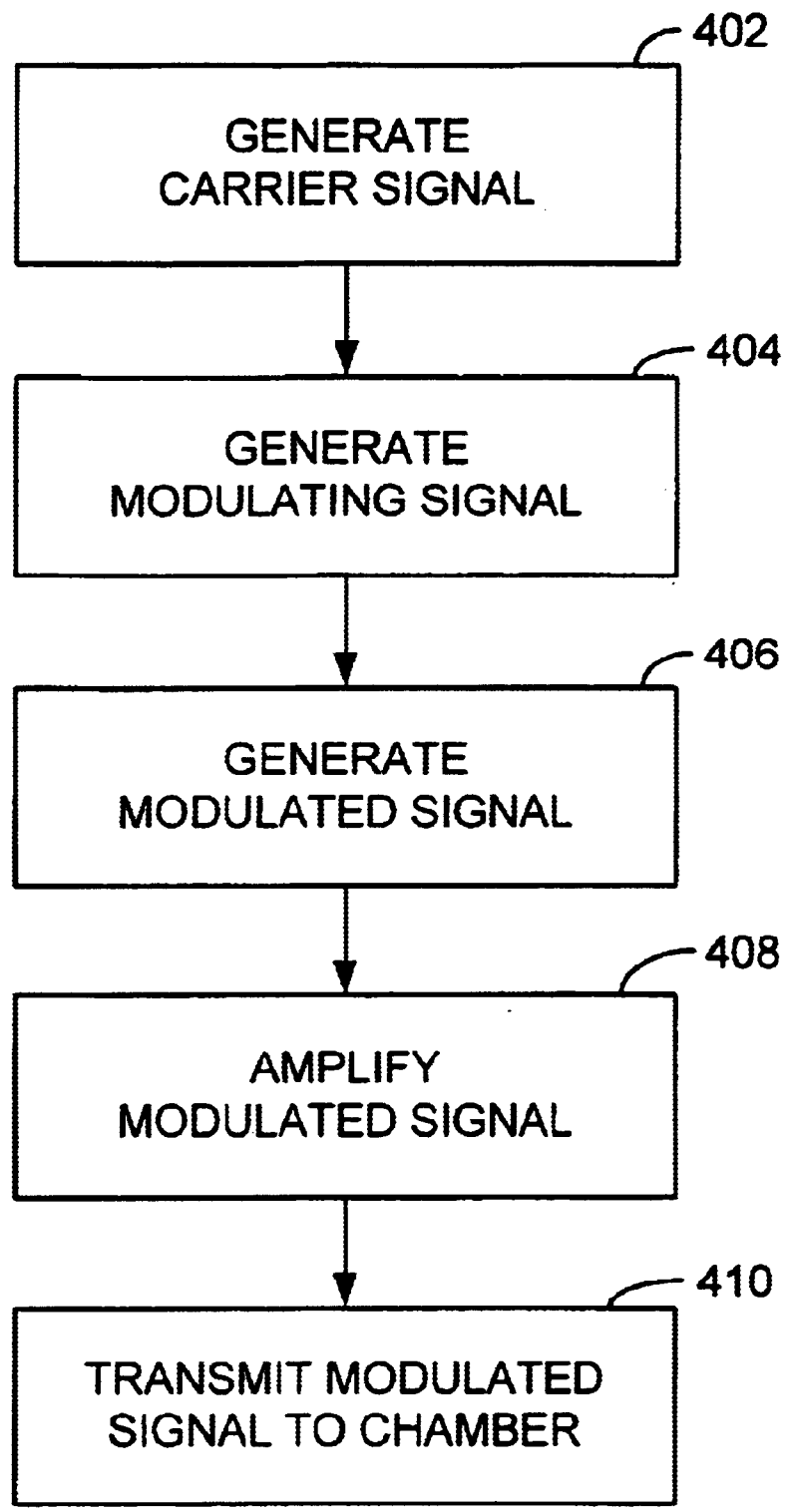
FIG. 4 a flowchart illustrating a method according to an embodiment of the invention.

With reference to both FIGS. 3 and 4, the carrier source 302 generates a first signal including a radio frequency (RF)

carrier signal (step 402). The carrier signal may have any suitable waveform, frequency or amplitude. For instance, the frequency of the carrier signal may be from about 1 MHz to about 200 MHz. In a typical example, the first signal may be a sinusoidal signal at a frequency of about 13.56 MHz, the frequency allocated by the Federal Communications Commission of the United States Government. While the carrier signal may have any suitable waveform, in some embodiments, the carrier signal is a sinusoidal waveform.

The modulation source 304 generates one or more modulating signals (step 404) to modulate the carrier signal. The one or more modulating signals may have any suitable waveform, frequency or amplitude. For example, suitable waveforms include triangular, saw-tooth, or sinusoidal waveforms. In some embodiments, the one or more modulating signals have a sinusoidal waveform. The modulating signals may be used to modulate the amplitude or frequency of the carrier signal.

For the frequency modulated embodiments, the modulating signal may be at a lower frequency than the carrier signal. For example, in preferred embodiments, the modulation frequency, $\omega_m$, may be about one or two orders of magnitude lower than the carrier frequency, $\omega_c$. For example, the modulation frequency may be about 0.1 times or less, or about 0.1 to about 0.01 times the carrier frequency when the carrier signal is frequency modulated.

When the modulation frequency is small compared to the carrier frequency, substantially all of the modulated carrier signal can still pass through the matching network adapted for the carrier frequency. This is true even if the modulated carrier signal includes frequency components which are higher and lower than the carrier frequency. For example, a typical matching network adapted to permit power at 100 MHz to pass to the chamber can also permit a substantial amount of power at frequencies between 98 MHz to 102 MHz to pass to the chamber without being reflected back to the power source. When a modulating signal less than about 1 MHz modulates a carrier frequency of 100 MHz, the frequency of the modulated carrier signal fluctuates within the range of 98 MHz to 102 MHz.

The modulator 306 receives the carrier signal from the carrier source 302 and the modulating signal from the modulation source 304 and modulates the carrier signal to generate a modulated signal (step 406). The carrier signal is modulated to produce a modulated signal with any suitable waveform. As noted, the modulated carrier signal may be amplitude modulated, frequency modulated, or may be both amplitude and frequency modulated. The modulated carrier signal may be complex or simple. When the carrier signal is both frequency and amplitude modulated, the carrier signal may be modulated with an amplitude modulating signal and a frequency modulating signal. Many of the modulation techniques used in embodiments of the invention are well known in the TV and radio broadcast industries.

Figure 5:
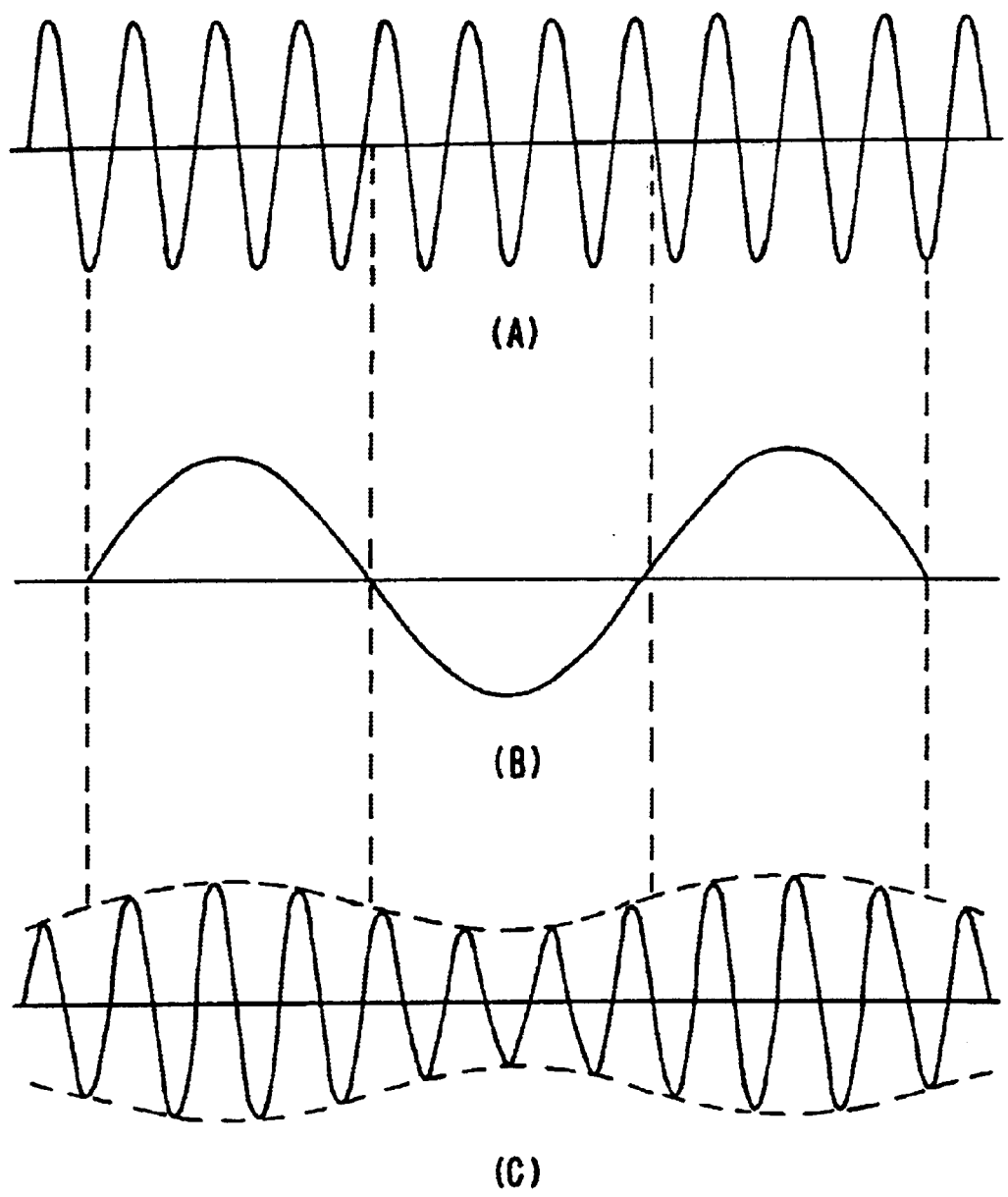
FIGS. 5(A) to 5(C) respectively show waveforms for a carrier signal, a modulating signal, and an amplitude modulated signal according to embodiments of the invention.

The waveforms of both the modulating signal and the carrier signal are sinusoidal in some amplitude modulated embodiments. For example, FIG. 5(B) shows an example of a waveform of a sinusoidal modulating signal that modulates the carrier signal shown in FIG. 5(A). As shown, the modulating signal has a lower frequency than the carrier signal. The resulting modulated signal is amplitude modulated and is shown in FIG. 5(C). The graph in FIG. 5(C) shows an amplitude modulated waveform and an envelope corresponding to the modulating signal is shown in FIG. 5(B). The amplitude modulated waveform has peaks with amplitudes greater than and less than the carrier signal peaks.

For an amplitude modulated signal embodiments, the carrier signal can be of the form $E_o\sin(\omega_c t)$ and the modulating signal may be of the form $\sin(\omega_m t)$. $\omega_c$ and $\omega_m$ represent the carrier and modulating frequencies, respectively. $E_o$ represents a value for the initial E-field and t is the time. After the modulating signal modulates the carrier signal, the corresponding amplitude modulated signal may then be of the form $$E(\omega_c,t)=E_o[1+\beta\sin(\omega_m t)]\sin(\omega_c t) \quad (1)$$

In the above equation, $\beta$ is a modulation index and indicates the relative strengths of the carrier and modulating signals. Generally, $\beta$ is less than or equal to one. The modulation index can be varied to adjust the amplitude of the carrier signal and consequently, the power delivered to the chamber.

In the amplitude modulated embodiments, the amplitude modulated signal contains peaks with amplitudes greater than or less than amplitudes of peaks of the first RF signal. The amplitudes of the peaks of the amplitude modulated carrier signal can be increased or decreased by modifying one or more of the carrier signal power, the degree of amplification of the modulated signal, or the modulation index. Increasing or decreasing the peak amplitudes of the modulated signal can increase or decrease the total RF power delivered to the plasma and/or can change the waveform for the modulated RF signal. The amplitudes of the peaks of the carrier signal can be changed without making significant hardware changes.

Figure 6:
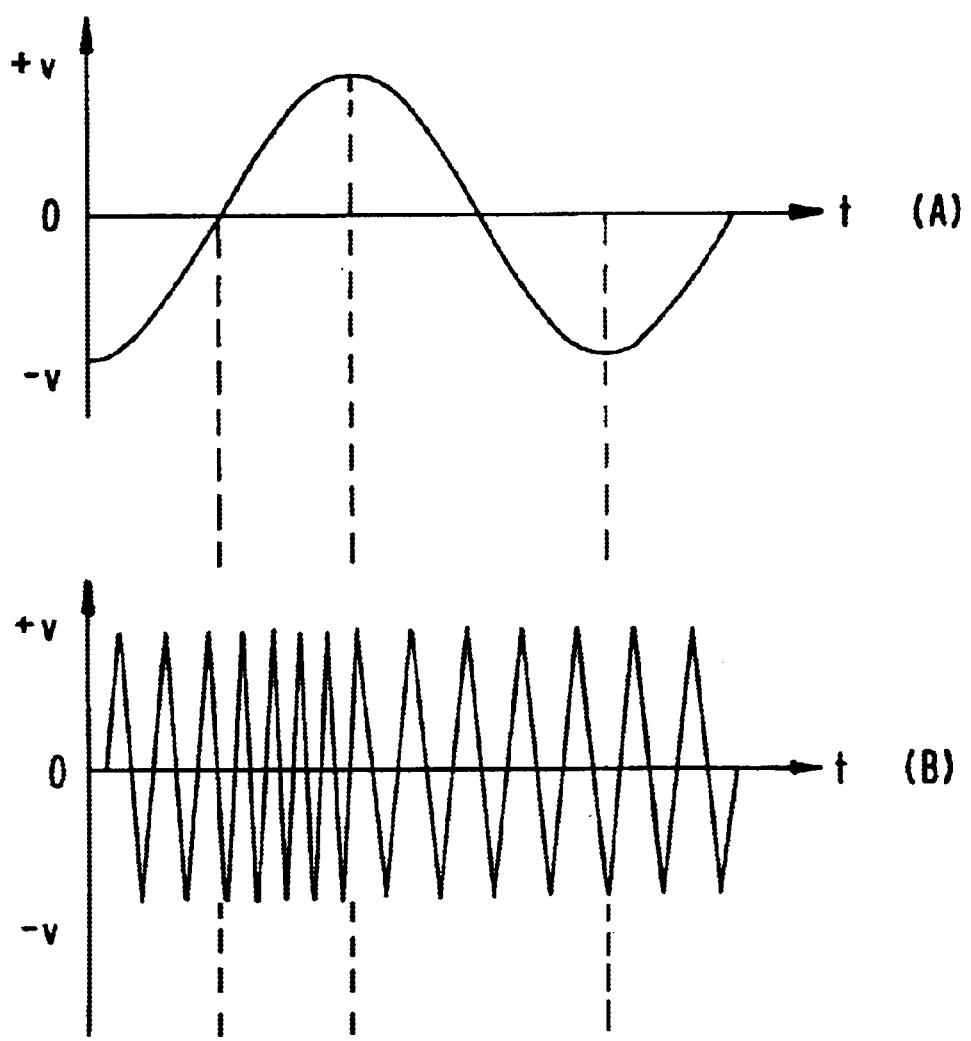
FIGS. 6(A) to 6(B) respectively illustrate waveforms of a modulating signal, and a waveform for a frequency modulated signal according to embodiments of the invention.

The waveforms for both the carrier signal and the modulating signal may be sinusoidal in the frequency modulated embodiments of the invention. FIG. 6(A) shows an example of a waveform of a sinusoidal modulating signal that modulates the frequency of a carrier signal (not shown). The resulting frequency modulated carrier signal is shown in FIG. 6(B). As shown in FIG. 6(B), the amplitudes of the peaks of the frequency modulated waveform remain constant in this embodiment. Also, the frequency modulated signal may have components with higher and lower frequencies than the carrier signal frequency.

For the frequency modulated signal embodiments, the frequency modulated signal may be of the form:

$$E(\omega_c,t)=E_o[\exp(i\omega_c t)]\exp[i\beta\sin(\omega_m t)] \quad (2)$$

$\beta$ is again a modulation index and indicates the relative strengths of the carrier and modulating signals. $\omega_c$ and $\omega_m$ again represent the carrier and modulating frequencies, respectively. The modulation component $\exp[i\beta\sin(\omega_m t)]$ may be expanded in terms of the Bessel function $J_n(\beta)$ as:

$$\exp[(i\beta\sin(\omega_m t)]=\Sigma J_n(\beta)\exp(in\omega_m t) n=\ldots,-2,-1,0,1,2,\ldots$$

Substituting this expression into equation (2) gives:

$$E(\omega_c,t)=E_o\Sigma\{J_n(\beta)\exp[i(\omega_c+n\omega_m)t]\} n=\ldots,-2,-1,0,1,2,\ldots$$

In preferred embodiments, the amplifier 308 receives a low power modulated signal and then amplifies it before delivering the modulated signal to the chamber (step 408). Prior to being amplified, a lower power carrier source 302 and a low power modulation source 304 can be used to produce the modulated signal. Low power is generally power at about 100 Watts or less. After receiving the low power modulated signal, the amplifier 308 amplifies its power to generate a high power modulated power signal.

The magnitude of the average power applied to the chamber may vary according to the particular process run on the plasma processing apparatus. The amplified high power modulated power signal may, for example, provide power in excess of 100 Watts to the chamber. For instance, in a typical CVD process, the power may be greater than about 1200 Watts. In a typical etch process, the power maybe greater than about 2000 Watts.

The modulated power signal is output by the amplifier 308 via a transmission line 309 and is received by a matching network 310. The matching network 310 receives the modulated power signal and provides impedance matching from the transmission line 309 to the plasma processing chamber 112 to ensure that substantially all of the power is delivered to the chamber. Any suitable matching network 310 may be used in embodiments of the invention as long as the matching network matches the frequency of the signal from the carrier source 302. For example, if the carrier source 302 supplies power at 13.56 MHz, the matching network 310 can be any suitable commercially available matching network designed for this frequency of power.

The modulated power signal may be applied to any suitable part of the apparatus 110 (step 410). For example, as shown in FIG. 3, the modulated power signal may pass through the matching network 310 and may be applied to the antennae coil 124. The antennae coil 124 applies the modulated power signal to reactant gases in the chamber 112 to produce a plasma. Alternatively, in some embodiments (e.g., in a capacitively-coupled plasma processing chamber) the modulated power signal may be provided to the pedestal, the gas manifold (not shown) or any other suitable portion of the apparatus.

Embodiments of the invention are not limited to the specific embodiments shown and described with respect to the Figures. For example, although the modulator 306 and the amplifier 308 are shown as separate devices, they may be combined in a single device. In another alternative embodiment, an amplifier is not needed. For example, the carrier source 302 may be a high power carrier source which generates a high power RF signal. The modulation source 304 can supply a signal which modulates the high power RF signal before it is applied to the reactant gas in the chamber 312.

Embodiments of the invention provide a number of advantages. For example, although the inventive apparatus embodiments can use less hardware than many conventional apparatuses, the apparatus embodiments can have more controllable processing parameters than the conventional apparatuses. For instance, fewer power sources, matching networks, modulators, etc. are used in the inventive apparatus embodiment shown in FIG. 3 than the conventional apparatus shown in FIG. 1. Moreover, in embodiments of the invention, by adjusting processing parameters such as the modulation index, the carrier signal power, and the modulation frequency, power signals with simple or complex waveforms can be produced. Consequently, the plasma can be tailored to the particular processing being run in the plasma processing chamber. In comparison, in the conventional apparatus shown in FIG. 1, two power signals at two frequencies and amplitudes are delivered to a reactant gas.

In preferred embodiments, the apparatus includes a single matching network and a single high power source. Using a single matching network and a single high power source provides a number of advantages.

By using only one matching network and one high power source, the resulting apparatus is less complex than a plasma processing apparatus using two matching networks and two high power sources. Eliminating a matching network and a power source also reduces the cost of the manufacturing the apparatus, since less components are needed to make the apparatus. Furthermore, because fewer components are present in the apparatus, the likelihood that the apparatus will become inoperative because of component failure is reduced. Lastly, when using one high power source instead of two power sources, less energy is consumed during operation resulting in lower operating costs. Advantageously, in embodiments of the invention, the complexity of an apparatus can be reduced (e.g., as compared to conventional dual frequency apparatuses) while still providing a number of controllable parameters for a process engineer to adjust.

Furthermore, when using a single matching network and a single power source, the problems associated with interfering signals can be reduced. As noted above, two power signals can interfere with each other and cause arcing. Because different waveforms are not being applied to the chamber at the same time when a single power source and a single matching network are used, the likelihood of arcing is reduced. Process parameters such as the RF power and the gas pressure need not be limited to reduce the likelihood of potential arcing. Consequently, in embodiments of the invention, processes with even wider gas pressure ranges and power variability can be practiced.

Also, by using a single matching network and a single power source, additional matching networks and power sources are not present and will not divert power away from the reactant gas. Consequently, substantially all of the power from the power source can be delivered to the reactant gas in the chamber. Power is thus delivered efficiently to the chamber in embodiments of the invention. Moreover, since an additional matching network and power source are not present, decoupling electronics are not needed to decouple the different power sources and matching networks. As noted above, the presence of decoupling electronics in a plasma processing apparatus further increases its cost and complexity.

In embodiments of the invention, high and low frequency signals are combined outside of the processing chamber under controlled conditions. Unlike conventional apparatuses, the interference between the carrier and modulating signals can be controlled by a process engineer before delivering the power signal to the chamber. The unintended interference of power signals within the plasma processing chamber can be avoided. Consequently, any unintended problems associated with the unintended interference of power signals are also avoided.

Although an inductively coupled chamber has been shown and described, embodiments of the invention are not limited thereto. Embodiments of the invention may be used with any suitable plasma process and any suitable plasma processing apparatus. Suitable processes include etching processes such as reactive ion etching, and deposition processes such as plasma-assisted chemical vapor deposition (PECVD) and reactive sputtering. The plasmas produced according to embodiments of the invention may be of the inductively- or capacitively-coupled type. Embodiments of the invention can be used to deposit or etch any suitable material including silicon containing materials such as silicon nitride, silicon oxide, and amorphous silicon.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention

What is claimed is:

1. A plasma processing apparatus comprising:

a carrier source adapted to generate a first RF signal at a carrier frequency;

a modulation source adapted to generate a second RF signal at a modulation frequency;

a modulator adapted to modulate the first RF signal with the second RF signal to form a frequency modulated signal;

a plasma processing chamber coupled to the modulator;

a transmission line for transmitting the frequency modulated signal; and a single matching network adapted to receive the frequency modulated signal to provide impedance matching from the transmission line to a plasma, and wherein the modulation frequency is less than about 0.1 times the carrier frequency.

2. The apparatus of claim 1 further comprising:

an amplifier adapted to amplify the frequency modulated signal to generate a high power frequency modulated signal.

3. The apparatus of claim 1 wherein the modulation source is further adapted to generate a third RF signal at an amplitude modulation frequency, and wherein the modulator is further adapted to modulate the first RF signal with the second RF signal and the third RF signal to form an frequency and amplitude modulated signal.

4. The apparatus of claim 1 wherein the second RF signal is in the form of a sine wave.

5. The apparatus of claim 1 wherein the apparatus is an etching apparatus.

6. The apparatus of claim 1 wherein the modulation frequency is from about 0.1 to about 0.01 times the carrier frequency.

7. The apparatus of claim 1 wherein the carrier source is at a frequency of about 13.56 MHz and wherein the single matching network is adapted to transmit power at a frequency of about 13.56 MHz to the plasma processing chamber.

* * * * *